(12) United States Patent
Yanase

(10) Patent No.: US 7,709,357 B2
(45) Date of Patent: May 4, 2010

(54) SILICON EPITAXIAL WAFER AND METHOD FOR MANUFACTURING THE SAME

(75) Inventor: Yoshio Yanase, Fujitu-gun (JP)

(73) Assignee: Sumco Corporation, Tokyo (JP)

( * ) Notice: Subject to any disclaimer, the term of this patent is extended or adjusted under 35 U.S.C. 154(b) by 179 days.

(21) Appl. No.: 11/235,091

(22) Filed: Sep. 27, 2005

(65) Prior Publication Data

US 2006/0068568 A1    Mar. 30, 2006

(30) Foreign Application Priority Data

Sep. 29, 2004    (JP) .............................. 2004-285369

(51) Int. Cl.
*H01L 21/20*    (2006.01)

(52) U.S. Cl. ................. 438/479; 438/481; 257/E21.09; 117/84

(58) Field of Classification Search ................. 438/407, 438/408, 540, 715, 481, 486, 489, 479; 257/E21.09, 257/E21.134, E21.461; 117/3, 34, 84
See application file for complete search history.

(56) References Cited

U.S. PATENT DOCUMENTS

| 4,349,394 | A  | * | 9/1982 | Wei ............................. 438/476 |
| 6,858,508 | B2 | * | 2/2005 | Ito ............................... 438/311 |
| 7,041,561 | B2 | * | 5/2006 | Baiocchi et al. ............. 438/270 |
| 7,052,974 | B2 | * | 5/2006 | Mitani et al. ................ 438/459 |
| 7,479,187 | B2 | * | 1/2009 | Otsuka ......................... 117/89 |
| 2005/0098092 | A1 | * | 5/2005 | Wilson et al. ................. 117/84 |

(Continued)

FOREIGN PATENT DOCUMENTS

JP    04-324621 A    11/1992

(Continued)

OTHER PUBLICATIONS

Yamamoto et al., "Study of the crystal growth of a (15,17,1) vicinal plane on a Si (110) surrface using high-temperature scanning tunneling microscopy"; J. Appl. Phys. vol. 75, No. 5 pp. 2421-2425; American Institute of Physics; Mar. 1, 1994.*

(Continued)

*Primary Examiner*—Ha Tran T Nguyen
*Assistant Examiner*—Daniel Whalen
(74) *Attorney, Agent, or Firm*—Pillsbury Winthrop Shaw Pittman, LLP

(57) ABSTRACT

This method for manufacturing a silicon epitaxial wafer includes: a step of growing an epitaxial layer having silicon on a silicon wafer having a main surface of {110}; and a cooling step of cooling the silicon wafer after growing the epitaxial layer. In a first aspect, in the cooling step, a rapid cooling at a cooling rate of more than 500° C./minute is performed in a range of 750° C. to 650° C. In a second aspect, in the cooling step, a passivation film is grown on a main surface of the epitaxial layer at a temperature of 720° C. or more. In a third aspect, a single crystal silicon wafer in which a misorientation angle of a main surface of {110} surface is in a range from 3.0° to 6.2° inclined towards a <110> direction perpendicular to the main surface or a <111> direction is used as the silicon wafer.

5 Claims, 7 Drawing Sheets

U.S. PATENT DOCUMENTS

2005/0285159 A1 12/2005 Chan et al.
2006/0131553 A1 6/2006 Yamanaka et al.

FOREIGN PATENT DOCUMENTS

JP 2001-253797 A 9/2001

OTHER PUBLICATIONS

Wolf et al., "Silicon Processing for the VLSI Era, vol. 1—Process Technology," $2^{nd}$ Edition, 2000, ISBN 0-9616721-6-1.*
Yamamoto et al., "Study Of The Crystal Growth Of A (15, 17, 1) Vicinal Plane On A SI (110) Surface Using High-Temperature Scanning Tunneling Microscopy"; J. Appl. Phys. vol. 75, No. 5; pp. 2421-2425; American Institute of Physics; Mar. 1, 1994.
Notice of Reasons for Rejection dated Mar. 8, 2007.

* cited by examiner

SILICON EPITAXIAL WAFER AND METHOD FOR MANUFACTURING THE SAME

BACKGROUND OF THE INVENTION

1. Field of the Invention

This invention relates to a silicon epitaxial wafer of which a main surface is {110} and a method for manufacturing the same, and more specifically relates to a silicon epitaxial wafer with high quality having low surface roughness and a manufacturing method thereof.

This application claims priority on Japanese Patent Application No. 2004-285369, filed on Sep. 29, 2004, the content of which is incorporated herein by reference.

2. Background Art

In general, a single crystal substrate having a main surface of {100} or {111} is used as a substrate for manufacturing a silicon epitaxial wafer; however in some cases, {110} single crystal substrates are used for some special MPUs and applications of semiconductor pressure sensors.

In a silicon epitaxial wafer manufactured using a single crystal substrate having a main surface of {110}, there are cases in which periodic stripe-like irregularities and surface roughening occur in a surface as shown in FIG. 6.

With regard to its surface roughness, for example, a roughness (Rms) measured by an atomic force microscope (AFM) may be 0.2 nm or more, and a P-V value may be 1.5 nm or more.

In the case in which those irregularities and surface roughening are large, the surface appears to be colored such as white, brown, or iridescent or appears to be clouded when observed visually under a high-luminance converged light. The surface roughening is likely to be caused by a formation of facet structures in a Si (110) surface as described in Non-Patent Document 1. In the case in which the irregularities due to the formation of these facet structures become excessively large, for example, they may cause defective characteristics in a semiconductor device fabricated thereon.

Therefore, those surface irregularities and surface roughening must be reduced.

Examples of a method for manufacturing a silicon epitaxial wafer using the above-mentioned single crystal substrate having the main surface of {110} may include a method in which an epitaxial growth is performed on a silicon single crystal substrate having a surface orientation of (110) (from −0.5° to +0.5°) in a same manner as that performed on a (100) single crystal silicon substrate. In this manufacturing method, as shown in AFM measurement results in FIG. 6, a surface may be formed which has periodic banded irregularities of several nanometers to several dozens of micrometers, or a surface may be formed which has irregularities and on which facets are formed.

As mentioned above, in the case in which those irregularities and surface roughening are large, the surface appears to be colored such as white, brown, or iridescent or appears to be clouded when observed visually under a high-luminance converged light.

Also, In the case in which the irregularities due to the formation of these facet structures become excessively large, for example, defective characteristics may be caused in a semiconductor device fabricated thereon. Therefore, those surface irregularities and surface roughening must be reduced.

(Non-Patent Document 1) Yamamoto et al., J. Appl. Phys. Vol. 75, No. 5, 2421 (1994).

SUMMARY OF THE INVENTION

The present invention has been made in view of the above problems and an object thereof is to provide a method for manufacturing a silicon epitaxial wafer having a main surface of {110} by which a silicon epitaxial wafer having a reduced surface irregularities and high quality can be manufactured.

Another object of the present invention is to provide a silicon epitaxial wafer with high quality of which surface irregularities are reduced.

A first aspect of a method for manufacturing a silicon epitaxial wafer of the present invention, the method includes: a step of growing an epitaxial layer having silicon on a silicon wafer having a main surface of {110}; and a cooling step of cooling the silicon wafer after growing the epitaxial layer, wherein in the cooling step, a rapid cooling at a cooling rate of more than 500° C./minute is performed in a range of 750° C. to 650° C.

In the cooling step after the epitaxial growth, by cooling rapidly in the temperature range of 750° C. to 650° C., migration of silicon atoms on a surface of the epitaxial wafer can be suppressed. Thereby, a formation of facet structures specific to Si (110) can be suppressed, accordingly surface irregularities can be reduced.

The cooling rate is set to be more than 500° C./minute because the migration of silicon atoms on the surface of the epitaxial wafer cannot be surpressed at a cooling rate of 500° C./minute or less.

A second aspect of a method for manufacturing a silicon epitaxial wafer of the present invention, the method includes: a step of growing an epitaxial layer having silicon on a silicon wafer having a main surface of {110}; and a cooling step of cooling the silicon wafer after growing the epitaxial layer, wherein in the cooling step, a passivation film is grown on a main surface of the epitaxial layer at a temperature of 720° C. or more.

In order to prevent a formation of surface facet structures in a temperature range from 720° C. to 690° C. in which the surface facet structures are formed, silicon atoms in the surface must be fixed so that they cannot move (migrate) at a temperature of 720° C. or more. For this purpose, forming the passivation film of other than a silicon single crystal on the surface is effective.

Examples of the passivation film include a nitride film formed by RTN (Rapid Thermal Nitridation) or LPCVD method, an RTO (Rapid Thermal Oxidation) oxide film, an ozone passivation film, and the like.

In particular, the nitride film formed by RTN can be applied as a passivation film for preventing the permeation of Na and other alkali metals as well as $H_2O$, as a masking material for oxidizing or etching, and as a capacitor capacitance film. These passivation films in the surface are formed in an epitaxial growth chamber or after transferring the wafer to a separate chamber. In the case in which the passivation film is formed by an oxidation, the film is preferably formed after transferred to a separate chamber in view of safety.

For the purpose of reducing the surface roughness, a thickness of the passivation film is sufficient to be 1 nm or less. In the case in which the passivation film is used in a subsequent process, the film is formed with a film thickness suitable for its purpose of use.

In the second aspect of the method for manufacturing a silicon epitaxial wafer of the present invention, a nitride film or an oxide film may be formed as the passivation film.

In comparison to other films, the nitride film, especially a nitride film formed by RTN has an advantage that it can be applied as a passivation film for preventing the permeation of Na and other alkali metals as well as $H_2O$, as a masking material for oxidizing or etching, and as a capacitor capacitance film. The oxide film has advantages that in comparison to other films, the film can be formed easily at low cost and the film can be removed easily and the like.

A third aspect of a method for manufacturing a silicon epitaxial wafer of the present invention, the method includes: a step of growing an epitaxial layer having silicon on a silicon wafer having a main surface of {110}; and a cooling step of cooling the silicon wafer after growing the epitaxial layer, wherein a single crystal silicon wafer in which a misorientation angle of a main surface of {110} surface is in a range from 3.0° to 6.2° inclined towards a <110> direction perpendicular to the main surface or a <111> direction is used as the silicon wafer.

FIG. 7 is a view showing a surface of an example of a single crystal silicon wafer in which a mis-orientation angle of a main surface of {110} surface is certain degrees inclined towards a <110> direction or a <111> direction, and FIG. 8 is a view showing a cross-section of the example of the single crystal silicon wafer. In FIG. 1, the <110> direction and the <111> direction are indicated by dashed arrows. Please note that in FIGS. 7 and 8, the mis-orientation angle is overdrawn in order to specify which direction it is inclined towards.

According to this method, a surface having extremely small surface roughness (P-V value) and in which monolayer step structures having heights of 0.19 nm are aligned in an ordered manner is formed over a wide region.

The reason in which the misorientation angle is set in the range of 3.0° to 6.2° is as follows.

The surface having extremely small surface roughness (P-V value) and in which monolayer step structures having heights of 0.19 nm are aligned in an ordered manner is formed in a surface which is inclined by 4.6° towards the <110> direction or <111> direction from the {110} surface.

Therefore, the ideal misorientation angle is 4.6°±0°; however the range of 4.6°±1.6° (3.0 to 6.2°) is defined in consideration of a slight allowable error, a processing error and the like.

In the third aspect of a method for manufacturing a silicon epitaxial wafer of the present invention, a step of annealing for 10 seconds or more may be included in the cooling step following the epitaxial growth.

By this annealing, the monolayer step structures are formed in a more clearly ordered manner.

The forming of these monolayer step structures ((15, 17, 1) facet structures) are reported, for example, in J. Appl. Phys. 75 (5), 2421, 1 Mar. 1994 and the like.

Here, this surface is of a type with which so-called surface roughening occurs and is in a state in which iridescence is seen when observed visually. However, a surface can be formed having small roughness in which an extremely flat orderly-formed terraced surface region extends over a wide range at an atomic level in the surface.

At less than 10 seconds, it is difficult to form the ordered monolayer step structures over the entire wafer surface and regions in which surface roughening is not improved may partially remain. The annealing time is preferably in a range from 1 to 2 minutes.

In the third aspect of a method for manufacturing a silicon epitaxial wafer of the present invention, the step of annealing may be performed in a range of 690° C. to 720° C.

A reason for the temperature range of 690° C. to 720° C. is as follows. At a temperature of 720° C. or more, facets are not formed, the surface is extremely flat, and thus surface roughening does not exist.

Since the monolayer step structures are formed in the temperature range of 720° C. to 690° C. in the cooling step, a duration in the temperature range of 720° C. to 690° C. needs to be lengthened so as to form the monolayer step structures in a more ordered manner over a wider area.

A first aspect of a silicon epitaxial wafer of the present invention includes: a silicon wafer having a main surface of {110}; and an epitaxial layer having silicon and being formed on the main surface, wherein the silicon epitaxial wafer is manufactured by the first aspect of the method for manufacturing a silicon epitaxial wafer of the present invention.

In this epitaxial wafer, facet structures specific to Si (110) are not formed and the surface irregularities are reduced.

A second aspect of a silicon epitaxial wafer of the present invention includes: a silicon wafer having a main surface of {110}; and an epitaxial layer having silicon and being formed on the main surface, wherein the silicon epitaxial wafer is manufactured by the second aspect of the method for manufacturing a silicon epitaxial wafer of the present invention.

The passivation film prevents a formation of facet structures in the epitaxial wafer surface.

A third aspect of a silicon epitaxial wafer of the present invention includes: a silicon wafer having a main surface of {110}; and an epitaxial layer having silicon and being formed on the main surface, wherein a misorientation angle of a main surface of {110} surface is in a range from 3.0° to 6.2° inclined towards a <110> direction perpendicular to the main surface or a <111> direction, and the silicon epitaxial wafer is manufactured by the third aspect of the method for manufacturing a silicon epitaxial wafer of the present invention.

In this epitaxial wafer, a surface having extremely low surface roughness and in which monolayer step structures having heights of 0.19 nm are aligned in an ordered manner is formed over a wide region.

A fourth aspect of a silicon epitaxial wafer of the present invention includes: a silicon wafer having a main surface of {110}; and an epitaxial layer having silicon and being formed on the main surface, wherein a misorientation angle of a main surface of {110} surface is in a range from 3.0° to 6.2° inclined towards a <110> direction perpendicular to the main surface or a <111> direction, and the silicon epitaxial wafer is manufactured by the third aspect of the method for manufacturing a silicon epitaxial wafer of the present invention in which a step of annealing for 10 seconds or more is included in the cooling step following the epitaxial growth.

A fifth aspect of a silicon epitaxial wafer of the present invention includes: a silicon wafer having a main surface of {110}; and an epitaxial layer having silicon and being formed on the main surface, wherein a misorientation angle of a main surface of {110} surface is in a range from 3.0° to 6.2° inclined towards a <110> direction perpendicular to the main surface or a <111> direction, and the silicon epitaxial wafer is manufactured by the third aspect of the method for manufacturing a silicon epitaxial wafer of the present invention in which a step of annealing in a range of 690° C. to 720° C. for 10 seconds or more is included in the cooling step following the epitaxial growth.

According to the first aspect of a method for manufacturing a silicon epitaxial wafer of the present invention, the migration of silicon atoms on the wafer surface can be suppressed, thereby a formation of facet structures specific to Si (110) can be reduced. Consequently, the surface irregularities can be reduced.

According to the second aspect of a method for manufacturing a silicon epitaxial wafer of the present invention, the passivation film prevents silicon atoms in the surface from moving in the temperature range of 720° C. or more. Thereby, facet structures cannot be formed in the wafer surface.

According to the third aspect of a method for manufacturing a silicon epitaxial wafer of the present invention, a surface of extremely low surface roughness and in which monolayer step structures having heights of 0.19 nm are aligned in an ordered manner is formed over a wide region.

Also, by annealing, the monolayer step structures are formed in a more clearly ordered manner. A surface can be formed having small roughness in which an extremely flat orderly-formed terraced surface region extends over a wide range at an atomic level in the surface.

PREFERRED EMBODIMENTS

Embodiments of this invention's silicon epitaxial wafer manufacturing method will now be described with reference to the drawings.

Figure 1:
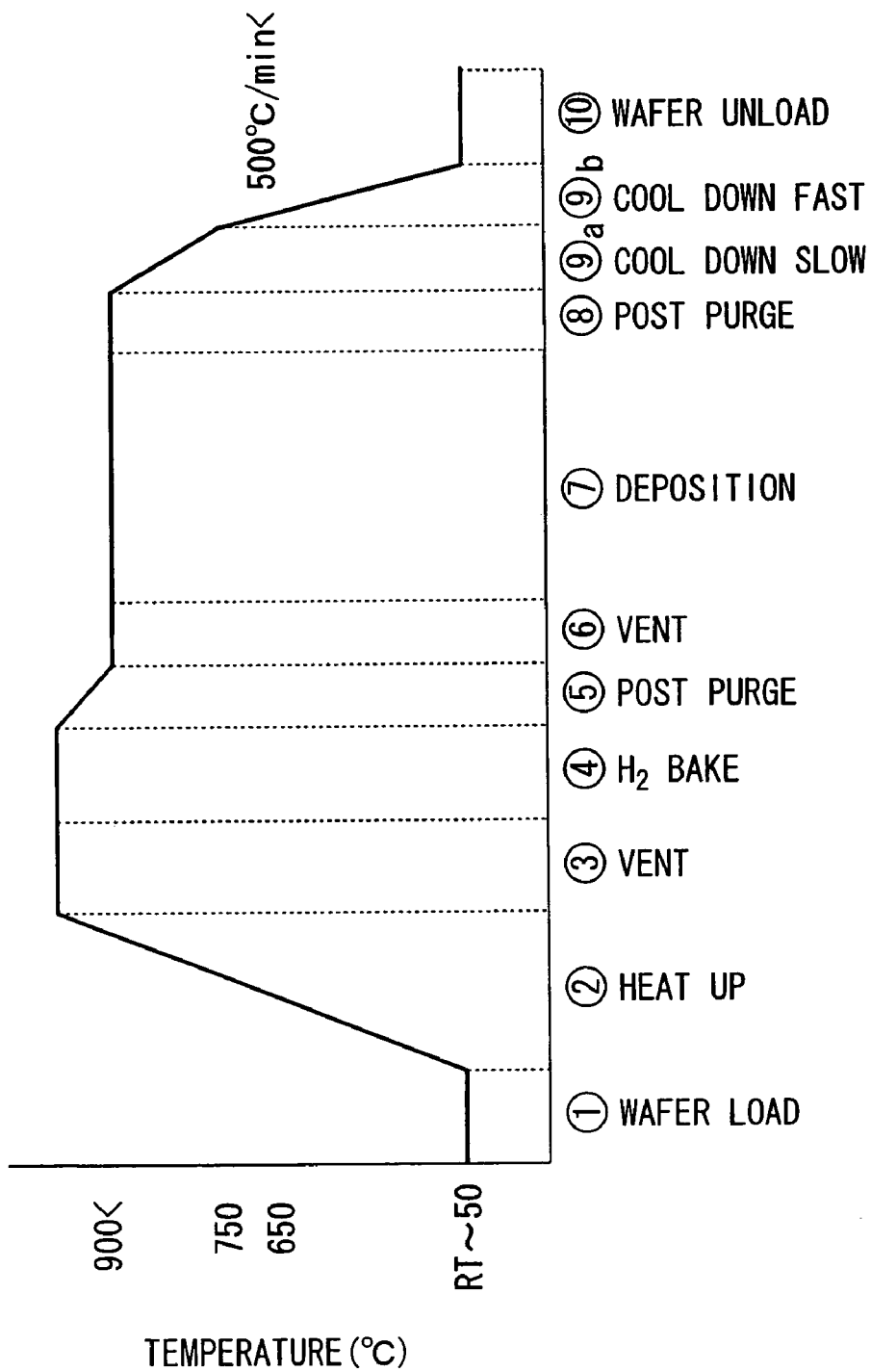
FIG. 1 is a graph illustrating manufacturing conditions for Example 1 of the present invention.
Figure 3:
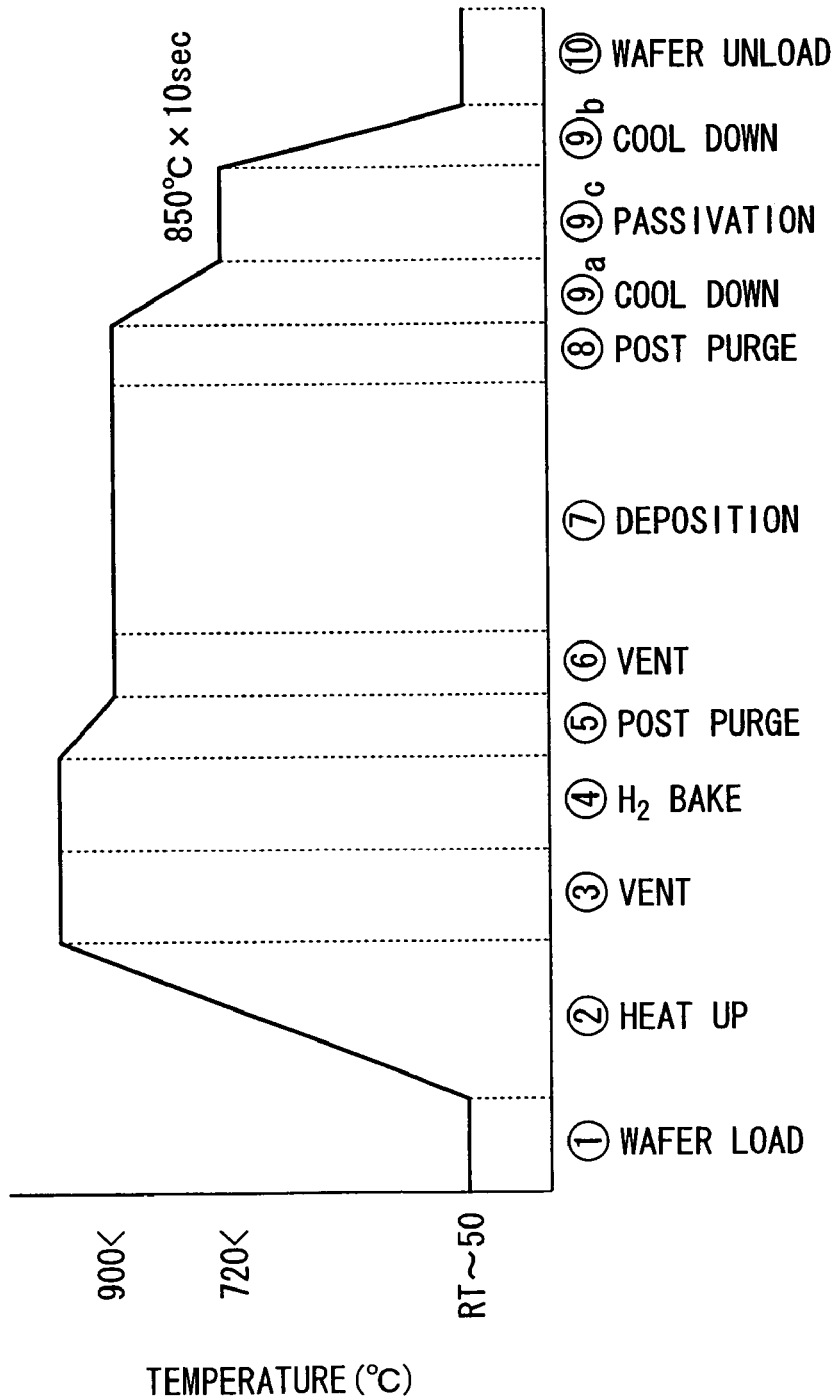
FIG. 3 is a graph illustrating the manufacturing conditions for Example 2 of the present invention.
Figure 4:
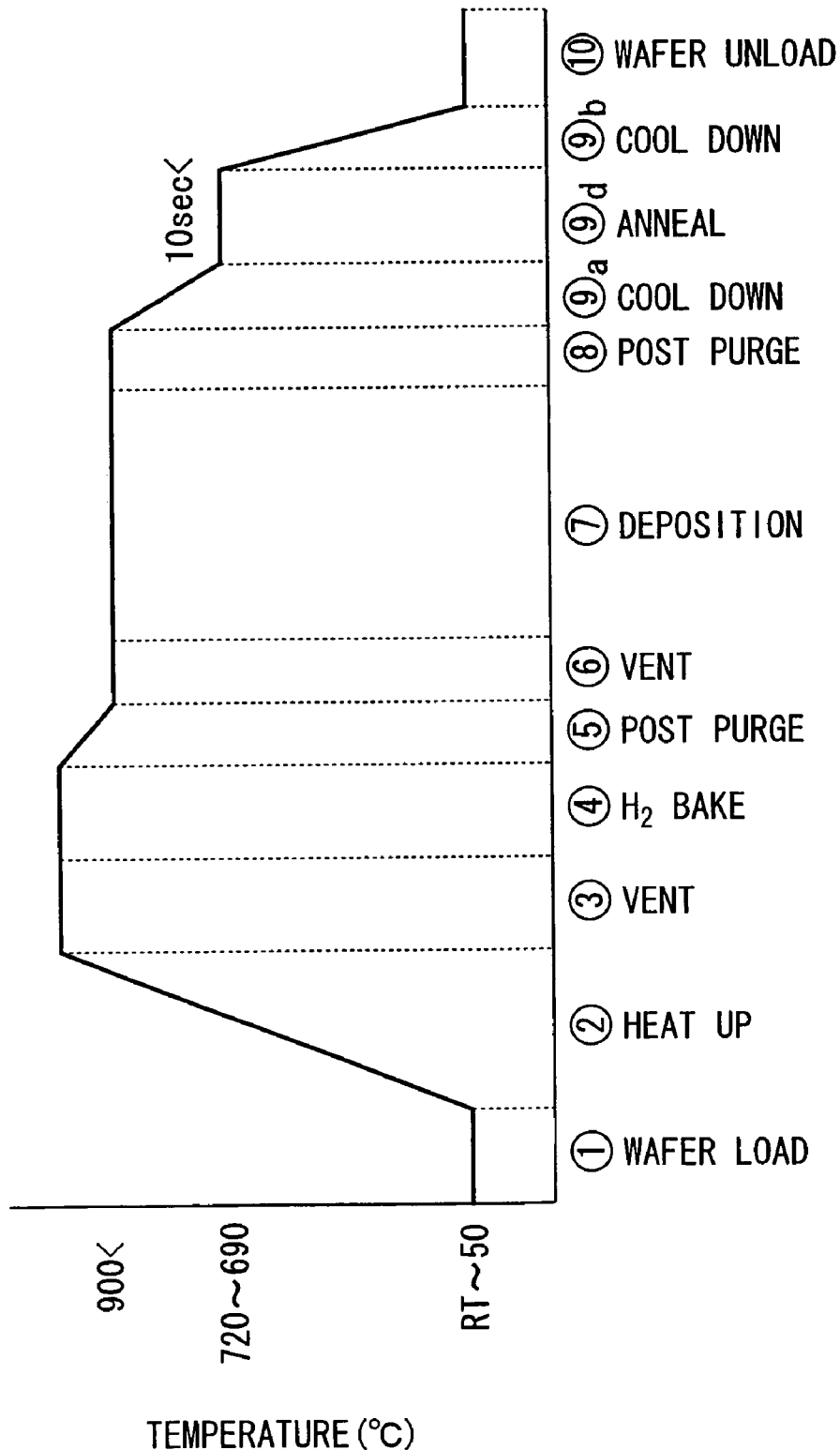
FIG. 4 is a graph illustrating the manufacturing conditions for Example 3 of the present invention.

FIGS. 1, 3, and 4 illustrate silicon epitaxial wafer manufacturing conditions (temperature conditions) of the embodiments. A vertical axis indicates temperature and a horizontal axis indicates time in each of the drawings.

A known method may be applied as the method for growing an epitaxial layer having silicon on a silicon wafer in which a main surface has a crystal face of {110}. For example, at first, the silicon wafer is loaded into a reactor (Wafer Load). Then, after heating (Heat Up) and venting (Vent), baking is performed in a hydrogen atmosphere ($H_2$ Bake). Next, after performing post purging (Post Purge) and main venting (Vent), heating is performed while supplying a raw material gas such as silane and the like. Thereby, an epitaxial layer having a main surface of {110} is grown on the main surface of the silicon wafer (Deposition).

After growing the epitaxial layer, post purging (Post Purge) is performed and then the silicon wafer is cooled (Cool Down).

Figure 2:
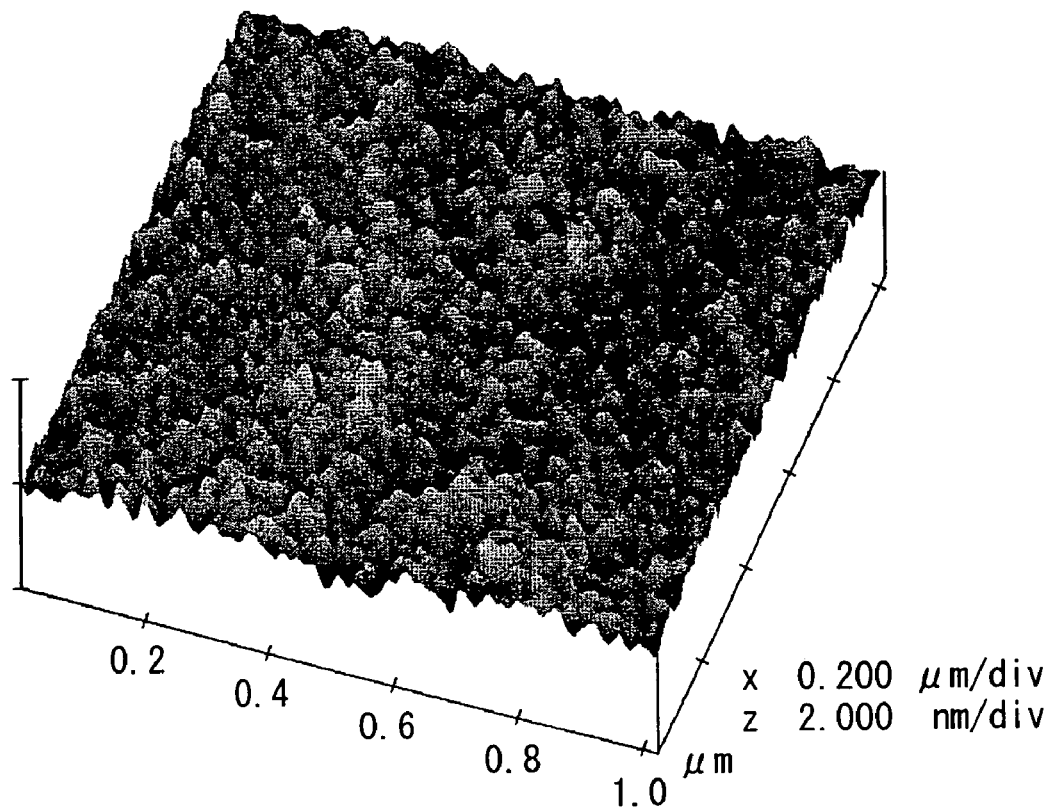
FIG. 2 is an AFM diagram showing a portion of a silicon epitaxial wafer surface manufactured under the manufacturing conditions for Example 1 of the present invention.

In this cooling process after the epitaxial growth, in a temperature range of 750 to 650° C., the silicon wafer is cooled more rapidly in the manufacturing method shown in FIG. 1 than in a prior method. FIG. 2 is a schematic view showing the results measured by AFM of the surface of the silicon epitaxial wafer manufactured under the manufacturing conditions of FIG. 1.

FIG. 3 illustrates manufacturing conditions for growing a passivation film on the wafer surface at a temperature of 720° C. or more.

FIG. 4 illustrates manufacturing conditions for annealing at 705° C.±15° C. (690 to 720° C.).

Figure 5:
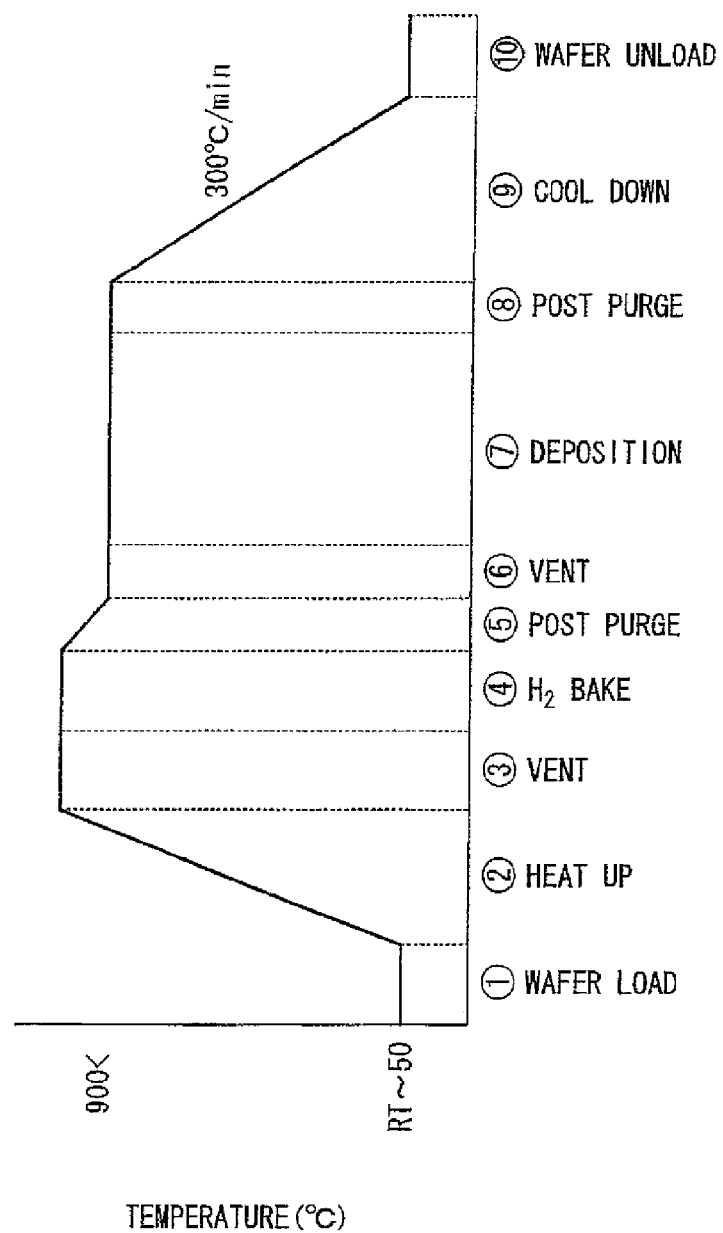
FIG. 5 is a graph illustrating conventional epitaxial wafer manufacturing conditions.
Figure 6:
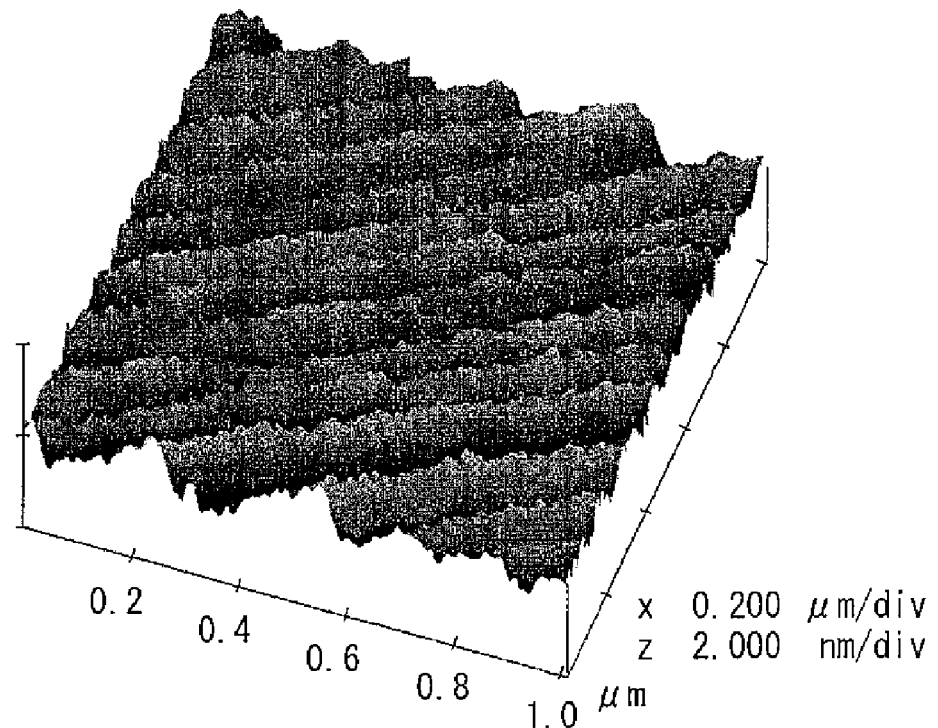
FIG. 6 is an AFM diagram showing a portion of a silicon epitaxial wafer surface manufactured under the conventional manufacturing conditions.
Figure 7:
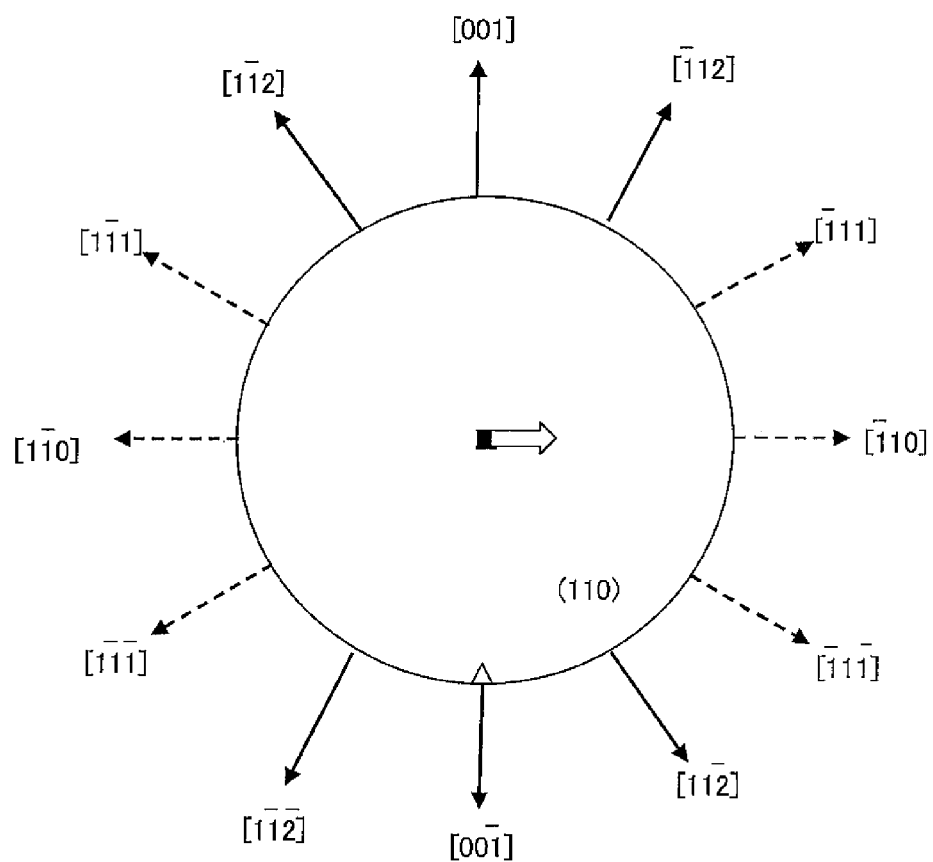
FIG. 7 is a view showing a surface of an example of a single crystal silicon wafer in which a mis-orientation angle of a main surface of {110} surface is certain degrees inclined towards a <110> direction or a <111> direction.
Figure 8:
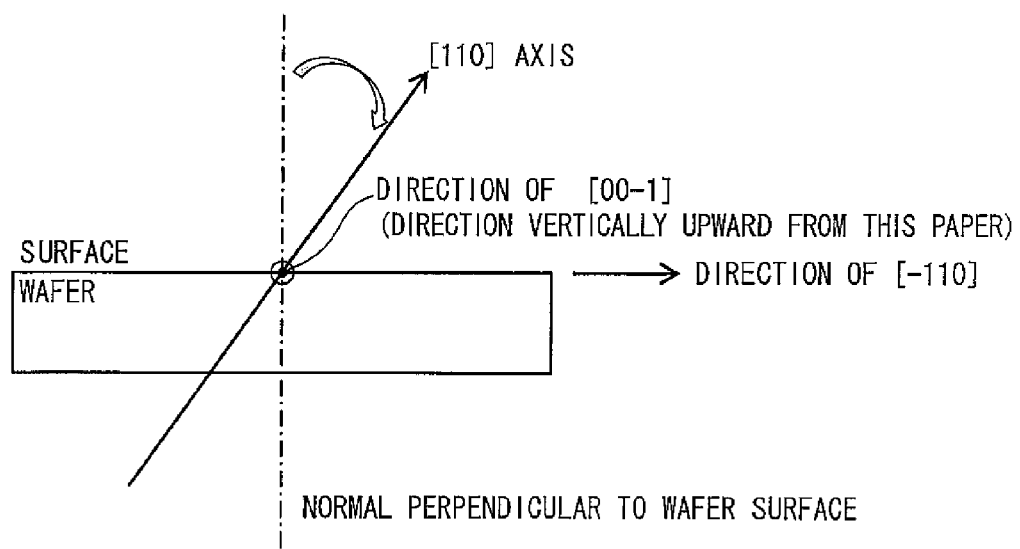
FIG. 8 is a view showing a cross-section of the example of the single crystal silicon wafer in which the mis-orientation angle of the main surface of {110} surface is certain degrees inclined towards the <110> direction or the <111 direction.

For comparison, conventional manufacturing conditions for a common silicon epitaxial wafer are illustrated in FIG. 5. FIG. 6 schematically shows the results of observation by AFM of an epitaxial silicon wafer manufactured and taken out from a reactor under the conventional manufacturing conditions of FIG. 5.

As mentioned above in the Background Art, in the epitaxial silicon wafer manufactured under these conventional manufacturing conditions, a roughness (Rms) is 0.2 nm or more and a P-V value is approximately 1.5 nm, and periodic stripe-like irregularities are observed at intervals of approximately 0.1 μm from an upper left to a lower right in FIG. 6.

In contrast, in the manufacturing conditions of FIG. 1, in the cooling process after the epitaxial growth, when a wafer temperature is 750° C. or less, a non-reactive gas such as an inert gas or nitrogen gas, or a carrier gas (hydrogen gas) is blown onto the wafer surface to cool the wafer surface rapidly at a rate of 500° C./minute or more.

Thus temperature range (720 to 690° C.) in which facet structures specific to the (110) surface are formed is passed in a shorter time, thereby a formation of random facet structures is suppressed. Accordingly, a silicon epitaxial wafer having comparatively small surface irregularities can be manufactured.

Meanwhile, in the manufacturing conditions shown in FIG. 3, in order to inactivate silicons in the surface (to prevent silicon atoms in the wafer surface from moving) in the temperature range (720 to 690° C.) in which the facet structures specific to the (110) surface are formed, a surface passivation film is formed in a temperature range higher than the temperature range (720 to 690° C.) in which the facet structures are formed.

Since the growth of the passivation film prevents the silicon atoms in the surface from moving in the temperature range in which the facet structures are formed, facets are not formed. Thereby, a surface having extremely small irregularities can be formed.

If necessary, after epitaxial growth, this passivation film may be removed by washing, etching, or the like.

The manufacturing conditions of FIG. 4 are for a method based on a completely different concept from the manufacturing conditions of FIG. 1 and the manufacturing conditions of FIG. 3.

In order to form a surface in which an extremely flat faceted surface is formed over a wider area at an atomic level, which appears as a clouded surface state at the visual level, a substrate is used which has a misorientation angle (4.6°±1.6° in the {110} direction perpendicular to the main surface or in the {111} direction) suitable for forming such a faceted surface, and extended annealing is performed intentionally so as to keep in the temperature range in which facet structures are formed for a longer duration.

As a result, a silicon epitaxial wafer can be manufactured which has a surface which is flat in atomic level.

EXAMPLES

Example 1

Examples of manufacturing silicon epitaxial wafers using the method for manufacturing a silicon epitaxial wafer of the present invention as a practical will now be described.

In this example, a silicon (110) substrate is used which is manufactured using a single crystal pulled by the CZ method, and which has a diameter of 200 mm and an initial oxygen concentration [Oi] of $14 \times 10^{17}$ atoms/cm$^3$ (conversion factor: $4.81 \times 10^{17}$ atoms/cm$^3$; the same conversion factor is used in all of the examples that follow).

A wafer surface grown under conventional epitaxial growth conditions (FIG. 5) has periodic-irregularities shapes formed thereon as shown in FIG. 6, and the formed surface has Rms of 0.2 nm or more and a P-V value of approximately 1.5 nm.

In contrast, a silicon epitaxial wafer is manufactured using the wafer substrate having the same specifications and under conditions shown in FIG. 1 in which when a wafer surface temperature drops to 800° C. during cooling down after an epitaxial growth, Ar gas is blown onto the surface so as to perform a rapid cooling at 500° C./minute or more in a temperature range of 800° C. to 600° C. The wafer surface epitaxially grown is in a state as shown in FIG. 2, and a surface roughness is reduced with the Rms being 0.15 nm or less and the P-V value being 1.2 nm or less.

A thickness of the epitaxial layer is 2.7 μm.

Example 2

In this example, a silicon (110) substrate having the same specifications as those of Example 1 is used.

The epitaxial growth conditions are shown in FIG. 3, and while cooling within a range not falling below 850° C. after epitaxial growth, the wafer is transferred to another reactor. Then, while keeping the wafer at 850° C. in this reactor, NH$_3$ gas is introduced for 10 seconds, thereafter the cooling process conditions are applied while introducing nitrogen gas.

A periodic structure such as that of FIG. 6 is not observed in a surface of the epitaxial wafer in which a thin nitride film of approximately 1 nm is formed.

In this example, a thickness of the epitaxial layer is 2.7 μm.

Example 3

In this example, a silicon (110) substrate is used which is manufactured using a single crystal pulled by the CZ method, and which has a diameter of 200 mm and an initial oxygen concentration [Oi] of $14 \times 10^{17}$ atoms/cm$^3$ (conversion factor: $4.81 \times 10^{17}$ atoms/cm$^3$).

In a slicing process, this wafer is processed so that a crystal orientation of the main surface is inclined with respect to [110] at an inclination angle of 4.6 degrees towards the direction of [−110] and at an inclination angle of less than 0.05 degrees towards the direction of [1-12].

In the cooling process after epitaxial growth under the conditions of FIG. 4, after annealing for 2 minutes at 695° C., a normal cooling process is carried out continuously.

The epitaxial wafer surface manufactured by the present conditions appears to be colored iridescent when observed visually; however, observation by AFM shows that an extremely flat and ordered surface is formed at an atomic level.

In this example, a thickness of the epitaxial layer is 2.7 μm.

Although preferred embodiments of this invention are described above, this invention is not limited to these embodiments. Addition, elimination, replacement, and other modifications of the arrangement are possible within a scope that does not fall outside the gist of the invention. This invention is not limited by the above description and is limited only by the scope of the attached claims.

What is claimed is:

1. A method for manufacturing a silicon epitaxial wafer, the method comprising:
   growing an epitaxial layer having silicon on a silicon wafer having a main surface of {110} at an epitaxial growing temperature; and
   cooling the silicon wafer from the epitaxial growing temperature after growing the epitaxial layer,
   wherein
   during the cooling, rapid cooling is performed at a cooling rate of more than 500° C./minute in a range of 750° C. to 650° C., and
   after growing the epitaxial layer and prior to the rapid cooling, a nitride film as a passivation film is grown on a main surface of the expitaxial layer.

2. A method for manufacturing a silicon epitaxial wafer, the method comprising:
   growing an epitaxial layer having silicon directly on a silicon wafer having a main surface of {110}; and
   cooling the silicon wafer after growing the epitaxial layer,
   wherein after growing the epitaxial layer and prior to cooling to less than 720° C., a nitride film having a thickness of 1 nm or less is grown as a passivation film on a main surface of the epitaxial layer at a temperature of 720° C. or more, and
   the passivation film is removed by washing or etching.

3. A method for manufacturing a silicon epitaxial wafer, the method comprising:
   growing an epitaxial layer having silicon directly on a silicon wafer having a main surface of {110}; and
   cooling the silicon wafer after growing the epitaxial layer,
   wherein a single crystal silicon wafer is used as the silicon wafer in which a misorientation angle of the main surface of {110} is in a range from 3.0° to 6.2° inclined towards a <110> direction or a <111> direction, and
   after growing the epitaxial layer and prior to cooling to less than 720° C., a nitride film having a thickness of 1 nm or less is grown as a passivation film on a main surface of the epitaxial layer at a temperature of 720° C. or more.

4. The method for manufacturing a silicon epitaxial wafer according to claim 3, wherein annealing for 10 seconds or more is performed after the epitaxial growth.

5. The method for manufacturing a silicon epitaxial wafer according to claim 4, wherein annealing is performed in a range of 690° C. to 720° C.

* * * * *